(12) United States Patent
Henrich et al.

(10) Patent No.: US 7,842,167 B2
(45) Date of Patent: Nov. 30, 2010

(54) SPUTTER APPARATUS WITH A PIPE CATHODE AND METHOD FOR OPERATING THIS SPUTTER APPARATUS

(75) Inventors: Jurgen Henrich, Limeshain (DE); Andreas Sauer, Grossostheim (DE); Andreas Geiss, Hanau (DE); Felix Brinckmann, Darmstadt (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 501 days.

(21) Appl. No.: 11/498,940

(22) Filed: Aug. 3, 2006

(65) Prior Publication Data
US 2007/0144891 A1 Jun. 28, 2007

(30) Foreign Application Priority Data
Dec. 22, 2005 (EP) .................. 05028124

(51) Int. Cl.
*C23C 14/00* (2006.01)
(52) U.S. Cl. .............. 204/192.12; 204/298.21
(58) Field of Classification Search .......... 439/169; 204/298.21, 192.12
See application file for complete search history.

(56) References Cited

U.S. PATENT DOCUMENTS

| | | | |
|---|---|---|---|
| 5,215,638 A | | 6/1993 | Hausler |
| 5,228,963 A | * | 7/1993 | Rose ................ 204/192.12 |
| 5,630,724 A | * | 5/1997 | Lange et al. ............ 439/164 |
| 5,814,195 A | | 9/1998 | Lehan et al. |
| 6,488,824 B1 | * | 12/2002 | Hollars .............. 204/192.22 |
| 2004/0149576 A1 | | 8/2004 | Crowley |
| 2006/0137968 A1 | * | 6/2006 | Hartig ................ 204/192.1 |

FOREIGN PATENT DOCUMENTS

| | | |
|---|---|---|
| DE | 41 26 236 A1 | 2/1993 |
| EP | 0 703 599 A1 | 3/1996 |
| EP | 703599 A1 * | 3/1996 |
| EP | 0 500 774 B1 | 7/1997 |
| JP | 10109834 A * | 4/1998 |
| SU | 758345 B * | 8/1980 |
| SU | 1520619 A * | 11/1989 |

OTHER PUBLICATIONS

Machine Translation to Susaki 10-109834 published on Apr. 1998.*
Wright, et al., Design Advances and Applications of the Rotatable Cylindrical Magnetron, J. Vac. Sci. Technol. (1986).

* cited by examiner

*Primary Examiner*—Nam X Nguyen
*Assistant Examiner*—John Brayton
(74) *Attorney, Agent, or Firm*—Fulbright & Jaworski L.L.P.

(57) ABSTRACT

A sputter apparatus with a pipe cathode is arranged such that the supply of power, cooling fluid and other media to the pipe cathode takes place via flexible lines or tubes which can be wound about a receptor. If the pipe cathode completes a pendulum movement, the lines and/or tubes are wound onto the receptor or wound from it. The pendulum movement of the pipe cathode is preferably such that the pipe cathode is rotated by a certain first angle in a first direction and subsequently by a certain second angle in a second direction, the second angle differing from the first angle. Methods for operating the sputter apparatus are also disclosed.

22 Claims, 7 Drawing Sheets

SPUTTER APPARATUS WITH A PIPE CATHODE AND METHOD FOR OPERATING THIS SPUTTER APPARATUS

BACKGROUND AND SUMMARY OF THE INVENTION

This application claims priority from European Patent application No. 05 028 124.5 filed Dec. 22, 2005, incorporated herein by reference in its entirety.

The invention relates to a sputter apparatus with a pipe cathode and to methods of operating the apparatus.

Applying layers onto substrates frequently takes place by means of a sputter process. In this sputter process substrates, for example glass or synthetic films, are introduced into a vacuum chamber in which a plasma is located.

The positive ions of the plasma are therein transported onto a target which is located at a cathode. These positive ions strike particles out of the target and these particles are transported toward the substrate to be coated and are deposited there.

In the proximity of the target permanent magnets are frequently disposed in order to increase the number of ions in the plasma whereby even more particles can be struck out of the target. Such a combination of permanent magnets and cathode is referred to as a magnetron.

In principle, one differentiates herein between planar and round or tubular magnetrons.

In the case of the tubular magnetrons a tubular target is placed onto the outside of a cylindrical cathode. This overall configuration can rotate about the longitudinal axis of the cathode. Since in these tubular magnetrons the yield of the target material is higher than in planar magnetrons, these tubular magnetrons are increasingly gaining in importance.

For example a cylindrical magnetron is known which is located in a vacuum chamber (EP 0 500 774 B1). The target structure herein rotates about its longitudinal axis while the magnets are stationary.

Furthermore is known a magnetron cathode rotating about the longitudinal axis comprising such a magnet configuration, such that two different opposing substrates are coated simultaneously (DE 41 26 236 A1).

A rotary cathode with at least one target disposed thereon is also described (EP 0 703 599). Instead of rotating about its own axis, the rotary cathode carries out an oscillating rotary movement, wherein the angle of oscillation is up to 90°. This is intended to solve the task of being able to change the target material rapidly and without opening the vacuum installation.

U.S. published patent application 2004/0149576 A1 discloses a sputter apparatus which includes a rotatable receptor, in which is located a coaxial cooling tube. An energy supply cable is here connected to a sputter magnetron.

Furthermore is known a rotatable and tubular hollow cathode in which an AC current supply line is connected to the hollow cathode (U.S. Pat. No. 5,814,195).

Lastly, a pipe cathode is also known which comprises a rotatable leadthrough for a water supply, at whose atmospheric side, fixed receptor water hoses are attached (M. Wright et al., "Design advances and applications of the rotatable cylindrical magnetron", Journal of Vacuum Science and Technology, Part A, AVS/AIP, Melville, N.Y., US, Vol. 4, No. 3, 1986, pp. 388-392, XP002314779, ISSN 0734-2101).

The task of the invention is to provide a sputter apparatus with a pipe cathode in which the supply of the pipe cathode takes place via flexible conducting line elements.

This task is solved according to the present invention.

The invention thus relates to a sputter apparatus with a pipe cathode and a method for operating this sputter apparatus. The supply of current, cooling fluid and other media to the pipe cathode herein takes place via flexible lines or tubing which can be wound about a receptor. When the pipe cathode executes a pendulum movement, the lines and/or tubes are wound onto the receptor or unwound from it. The pendulum movement of the pipe cathode is therein preferably such that the pipe cathode is rotated by a specific first angle in a first direction and subsequently by a specific second angle in a second direction, the second angle being different from the first angle.

The advantage attained with the invention comprises in particular that the supply with cooling fluid and/or current can take place through flexible lines or hoses. Therewith disposing a rotating seal, for example at the water leadthrough can be omitted since it is no longer necessary to transfer the cooling medium from a static to a rotating part. The water hose is disposed directly on the rotating pipe cathode.

Moreover, the technically highly complex rotary leadthroughs require much space, such that the solution according to the invention is additionally space-saving.

It is also of advantage in the invention that it becomes possible to supply the pipe cathode, for example via a cable, with current, wherewith the technically complex function components of a sliding contact can be omitted and, consequently, the current is not limited. The sputter power can therewith be increased. Of disadvantage in the conventional sliding contacting is the generation of particles. In the case of contacting in vacuum these particles can become deposited on the substrates to be coated, which leads to the formation of pin holes in the coating. If the sliding contacts, and therewith the power supply lines, are disposed at the atmospheric pressure side, the metallic structural parts of bearing and rotary leadthrough can be damaged through eddy currents when using AC current.

A further advantage of the invention comprises that flexible measuring or signal lines can also be connected with the pipe cathode. For example, it becomes hereby possible to determine the target temperature. If the target temperature is on the verge of reaching a critical value or of exceeding it, the cooling means supply can be increased via a control line.

Disposing the flexible supply elements takes place in such manner that the pipe cathode, as is the case in the conventional sputter processes, can continue to be rotated by at least 360° about its own longitudinal axis. The rotation takes therein place in the form of a discontinuous circular movement, whereby a uniform erosion of the target material, and therewith a uniform coating of the substrate, continues to be given.

One advantage of the invention further also lies therein that the maintenance of the coating installation is facilitated, since the technically complex and complicated fixtures of rotary water leadthroughs and the sliding contacts are no longer present.

Lastly, the invention is also less prone to wear and tear.

An embodiment example of the invention is depicted in the drawings and will be described in further detail in the following. In the drawing show:

DETAILED DESCRIPTION

Figure 1:
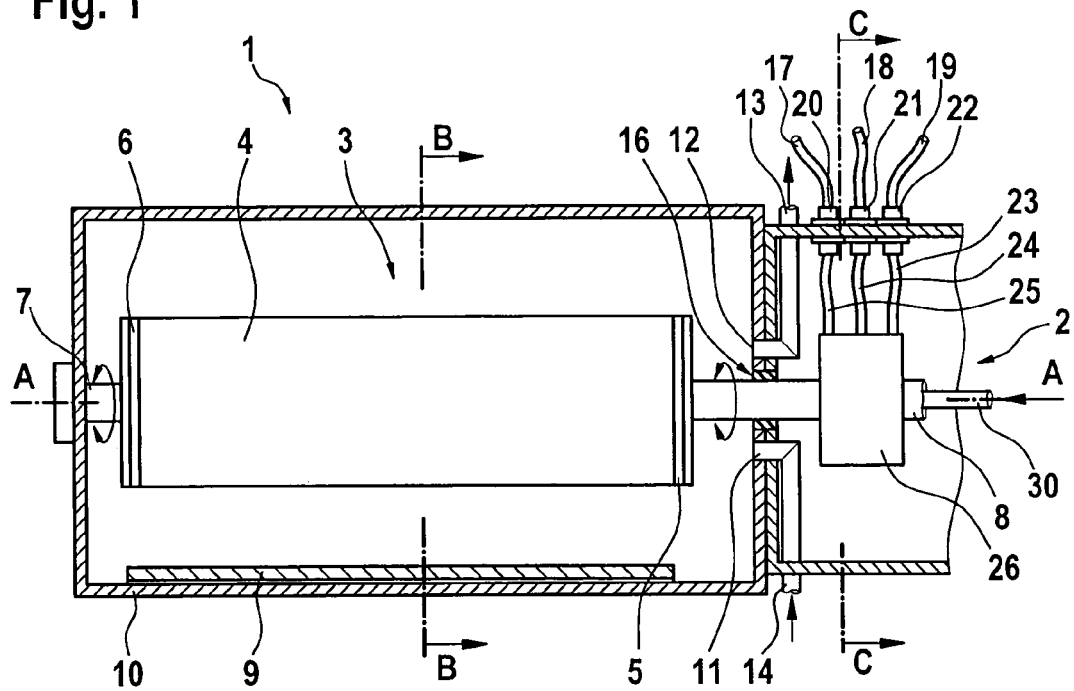
FIG. 1 a section through a vacuum chamber with a segment of a fore-vacuum chamber connected thereto, FIG. 2 a top view onto a segment of the vacuum chamber shown in FIG. 1 with the fore-vacuum chamber connected thereto, FIG. 3 a longitudinal section through the pipe cathode depicted in FIG. 1, FIG. 4 a section B-B through the pipe cathode shown in FIG. 1, FIG. 5a a section along C-C through a segment of the fore-vacuum chamber shown in FIG. 1 with a receptor and line elements for the power supply connected thereto, FIG. 5b a section along C-C through a segment of the fore-vacuum chamber depicted in FIG. 1 with a receptor and line elements for the cooling means supply connected thereto, FIG. 6 an enlarged segment of the pipe cathode depicted in FIG. 1 with the axle, FIG. 7 a segment of a spiral flat spring with several line elements.

FIG. 1 represents a longitudinal section through a vacuum chamber 1 of a sputter apparatus with a fore-vacuum chamber 2 connected thereto, with only a segment of this fore-vacuum chamber being shown. In the vacuum chamber 1 is located a pipe cathode 3 with a cylindrical target 4 placed thereon, which is mounted via connecting elements 5, 6.

The pipe cathode 3 is supported on an axle 7, 8, such that the pipe cathode 3 together with target 4 can rotate with the axle 7, 8 about its own longitudinal axis. Thereby uniform erosion of the target material is attained, the substrate 9 being disposed beneath the pipe cathode 3. The substrate 9 and the pipe cathode 3 with the target 4 disposed thereon are moved relative to one another, i.e. the substrate 9 is moved into or out of the plane of drawing.

The substrate 9 can be for example a film of a synthetic material or glass. The axle 7, 8 is developed as a pipe and in the axle 7, 8 is provided an internal tube 30. Via this tube 30 cooling means can be supplied from the outside, which serves for cooling the pipe cathode 3.

In the wall 10 of the vacuum chamber 1 can be seen an opening 11 for a gas inlet 14 and a further opening 12 for a gas outlet 13 and at least the gas inlet 14 is connected with a pumping system, which, however, is not shown.

Via the gas outlet 13 or the gas inlet 14 not only an appropriate vacuum can be generated, but the vacuum chamber 1 can, moreover, be supplied with a gas. This gas is preferably an inert gas, such as for example Ar. However, a reactive gas can also be added if reactive sputtering is desired.

The axle 8 leads from the vacuum chamber 1 via a vacuum-tight rotary leadthrough 16 into the fore-vacuum chamber 2, if the connection fittings are at atmospheric pressure. If the connection fittings are in the fore-vacuum, the reference number 16 denotes a bearing.

The axle 8 is connected with a drive, not shown here, which ensures that the pipe cathode 3 can rotate about its own axis.

In FIG. 1 are further shown several flexible line elements 17 to 19, which are connected with connection fittings 20 to 22 of the fore-vacuum chamber 2. These line elements can be for example cables, for the conduction of current, or hoses, for the transport of cooling means.

In the fore-vacuum chamber 2 further flexible line elements 23, 24, 25 lead in the direction of axle 8, with the line elements 23 to 25 being fastened on a spiral flat spring 26 and represent to some extent the continuations of the line elements 17 to 19. Consequently not every line element 23 to 25 is individually wound about the axle 8, but rather all together since all of the line elements are fixedly disposed on the spiral spring. Instead of a spiral spring 26, a cable drum with rewind spring can also be chosen.

The line elements 23 to 25 are preferably also hoses or cables. The ends of the hoses are (which is not visible in FIG. 1) carried in tubes, which extend within axle 8 and transport cooling means to the target.

Via these line elements 17, 25; 18, 24; 19, 23 connected one with another via the connection fittings 20 to 22, through a tube system described in further detail below, current or cooling means can be conducted through the axle 8, such that voltage can be applied on the pipe cathode 3 and/or cooling fluid can be supplied to the target.

However, apart from the cooling hoses and energy lines, it is also possible to lay signal lines, whose one end can be connected, for example, with a measuring device and whose other end with a sensor, this sensor being accommodated in the axle 8. It becomes thereby possible to measure for example the voltage at the cathode or the temperature of the coolant.

By disposing these sensors it is possible to control the sputter process optimally. Thus, next to the line elements for current or coolant supply, any number of line elements for the measurement of diverse parameters can be disposed in the fore-vacuum chamber 2.

The line elements 23 to 25 can also be disposed in the vacuum chamber 1 itself. However, in this case it would be necessary that at least the power cables are insulated. If the power cables are not insulated, flashovers may occur through contact with the plasma. In order to prevent a contact with the grounded wall of the vacuum chamber 1, this wall is provided with a protection against flashovers or disruptive breakdown, i.e. with an insulation. But in this case the spiral spring should be comprised of a dielectric fiber or composite material instead of spring steel, in order for the lines not to be in contact with each other. The spiral spring 26 itself can serve as a supply of sputter power. In this case it should be comprised, for example, of copper beryllium. The line elements 23 to 25 should be comprised of a gas-impermeable material, since otherwise the danger exists that, for example, coolant leaks from a gas-permeable line element and therewith affects the sputter process. It is, however, simpler to dispose the line elements outside of the sputter installation under atmospheric pressure, since this facilitates maintenance considerably.

In every case disposing the flexible line elements 23 to 25 on the axle 8 is of great advantage, since the technically complex function components of a conventional sliding contact as well as a rotary water leadthrough are no longer required. Since a sliding contact can be omitted, the electrical power no longer is limited, whereby the sputter rates can also be increased.

Figure 2:
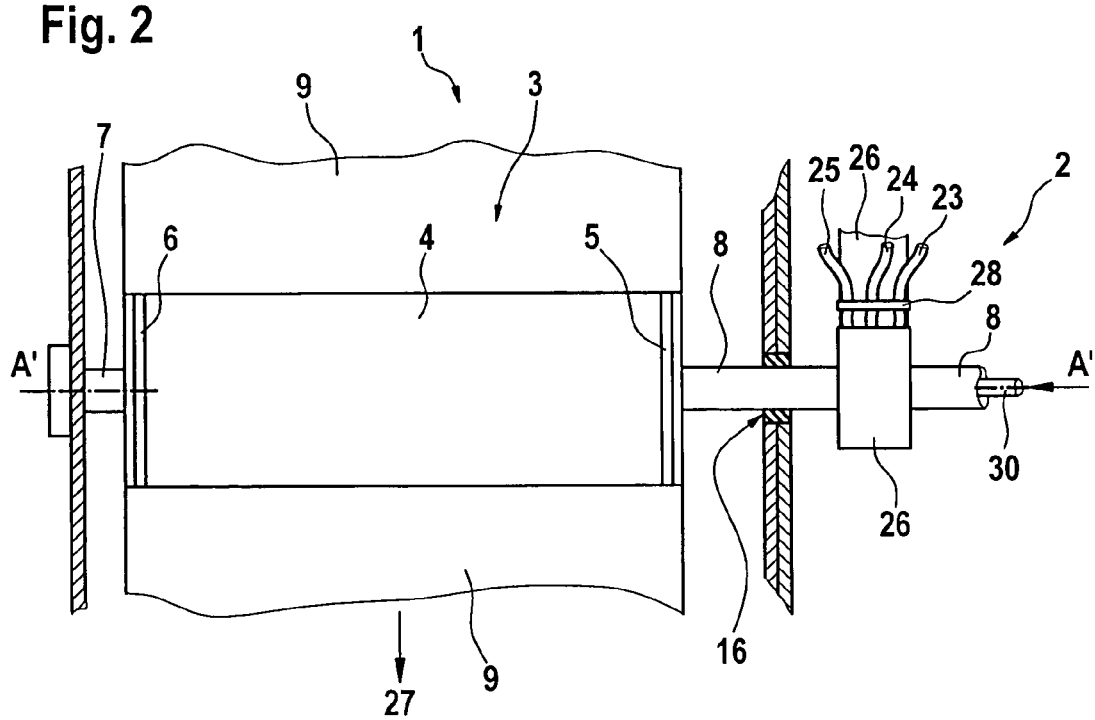

FIG. 2 shows the relative disposition of pipe cathode 3 and substrate 9 in a view from above, referring to the depiction of FIG. 1.

In this top view a segment is evident of the vacuum chamber 1 depicted in FIG. 1 with the fore-vacuum chamber 2 disposed thereon. The target 4 is fastened on the pipe cathode 3 by means of the connecting elements 5, 6. Beneath the pipe cathode 3 the substrate 9 moves in the direction of arrow 27. In the fore-vacuum chamber 2 are evident the line elements 23 to 25 and the manner in which they rest in contact on a spiral spring 26 and there are fastened on this spiral spring 26 by means of a fastening element 28. The spiral spring 26 is fastened on the wall of the fore-vacuum chamber 2, as will be described in further detail below.

The spiral flat spring 26 is at least partially wound up on axle 8 together with the line elements 23 to 25 fastened thereon. If the pipe cathode 3 is now rotated in one direction, the spiral spring 26 with the line elements 23 to 25 disposed thereon is wound out without the line elements 23 to 25 being detached from the axle 8.

Figure 3:
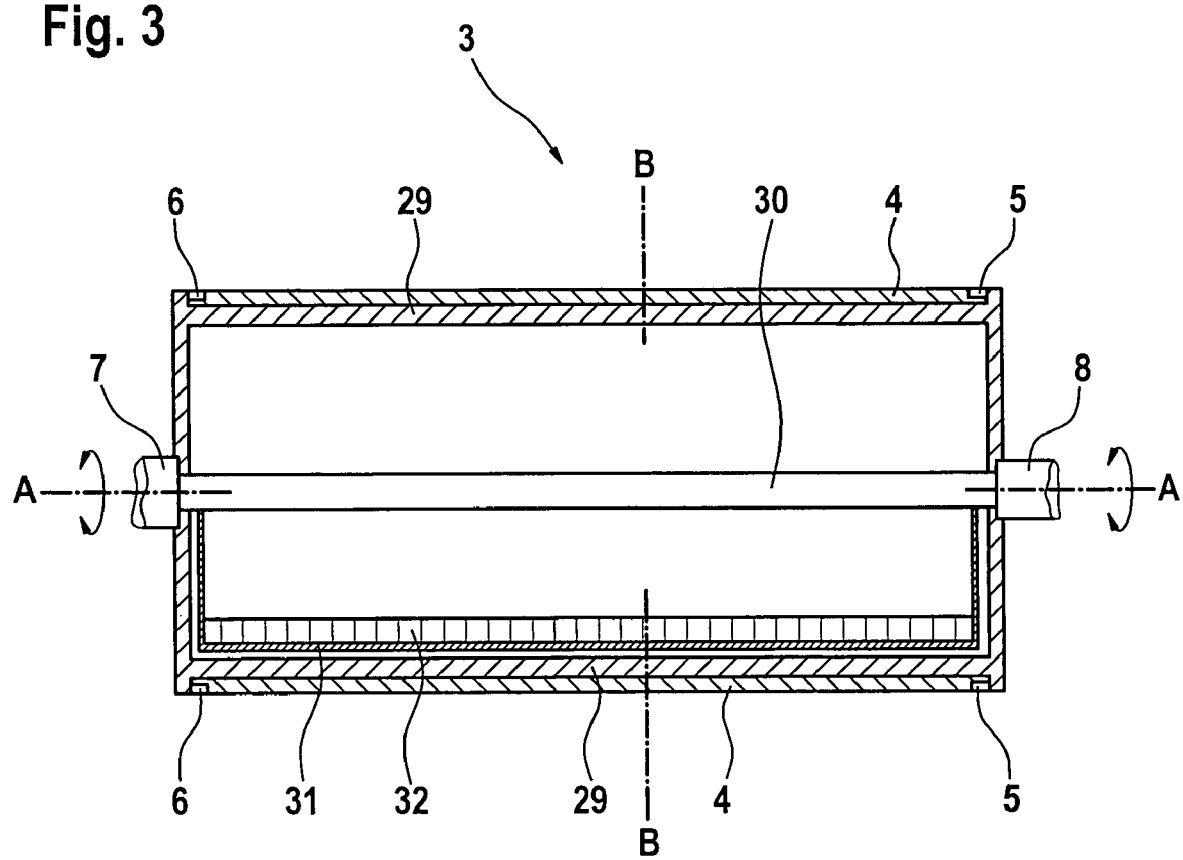

FIG. 3 shows a longitudinal section through the pipe cathode 3 depicted in FIG. 1. Evident is again the cylindrical target 4, which is disposed on the target carrier tube 29 and held by means of fastening elements 5, 6. As a portion of the axle 7, 8 the internal tube 30 extends along line A-A through the pipe cathode 3. On this tube 30 is fastened a tub 31 in which are disposed several magnets, of which one magnet 32 is identified by means of a reference number.

If the pipe cathode 3 is now moved about its longitudinal axis the tub 31 with the magnets located therein does not move along with it. Tub 31 as well as also the tube 30, is therewith disposed stationarily.

Between the target 4 and the target carrier tube 29 an intermediate layer can additionally be provided, and this intermediate layer may be an adhesion or a partition layer, for example of graphite. The advantage of such a partition layer lies therein that the target can be readily removed again from the target carrier tube after the process has been completed.

Figure 4:
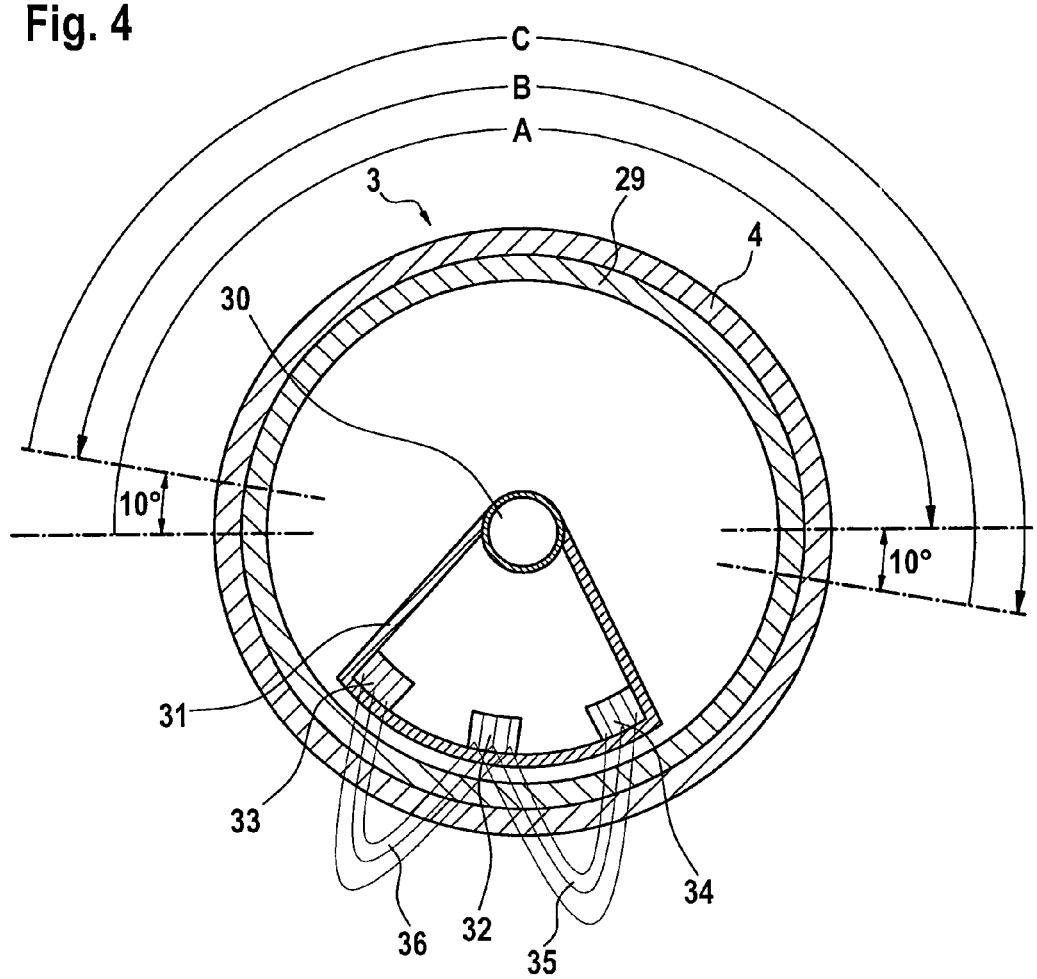

FIG. 4 shows a section along B-B through the pipe cathode 3 depicted in FIG. 1.

It shows the manner in which target 4 lies directly in contact on the target carrier tube 29. An intermediate layer is not provided in this example. FIG. 4 shows furthermore the tub 31 which is connected with the tube 30. In the tub 31 are depicted three magnets 32 to 34 which generate two magnetic fields 35, 36. Since the tube 30 with the tub 31 disposed thereon is disposed stationarily, the target carrier tube 29 rotates with the target 4 disposed thereon about the configuration of tube 30 and tub 31 with the magnets 32 to 34 disposed thereon. The magnetic field 35, 36 therewith also remains stationary, whereby a uniform ablation of the target 4 is ensured, since it moves about its own longitudinal axis. Hereby every region of the target 4 runs into the magnetic field 35, 36, in which region the sputter plasma develops, whereby the target 4 is uniformly eroded.

However, the pipe cathode 3 does not carry out a complete movement of 360° or more about its own axis, but rather a discontinuous one, the angle by which the pipe cathode 3 moves preferably being between 150° and 270°. The pipe cathode 3 is subsequently again moved back in the direction of its starting point. Thus a pendulum movement is carried out. The pipe cathode 3 can consequently carry out up to 1.5 revolutions, i.e. by ±270°.

To ensure uniform azimuthal erosion of the target, the pipe cathode 3 must be rotated for a longer time or after several pendulum movements by at least 360°, whereby an overlapping erosion takes place. The pipe cathode 3, as depicted in FIG. 4, can for example be rotated 180° in the clockwise direction, which is indicated by the curved arrow A, the return rotation i.e. in the counterclockwise direction, takes place by an angle which is smaller or also greater by a certain magnitude. If the angle is for example smaller by 10°, the pipe cathode 3 is only rotated back by 170°, which is shown by the curved arrow B, in order to carry out subsequently again a rotational movement by 180° in the clockwise direction, cf curved arrow C. This discontinuous pendulum movement is carried out at least until the pipe cathode 3 has rotated once about its own axis. In this case, in which the rotation takes place in the clockwise direction by an angle of 180° and the rotation back by an angle of 170°, the discontinuous pendulum movement takes place 36 times. After this discontinuous pendulum movement has taken place 36 times, the pipe cathode 3 has moved by 360°, i.e. once about its own axis.

The initial rotation can also be by an angle of 270° instead of an angle of 180°. However, the angle of this initial rotational movement is preferably between 180° and 270°.

When, after several pendulum movements, the pipe cathode 3 has overall rotated about its own axis, i.e. by at least 360°, the return movement takes place. The movement therein takes place in the clockwise direction by an angle of 170° and counter to the clockwise direction by 180°. At the point of reversal of the rotational movement an idle time may additionally be provided before the return rotation takes place. This idle time is very short, for example 0.5 seconds. In this way a possibly nonuniform erosion from the target material on the circumference of the target 4 in the region of the reversal point can be smoothed out.

In addition to the idle time, the pipe cathode 3 can also be rotated at different speed profiles, wherein the speed is kept constant over the major portion of the angle of rotation. Only near the reversal point is a deviation of this constant speed permitted. Over the speed profile at this reversal point the dwelling time of the plasma over the target is set such that through the metal removal no sites occur with nonuniform erosion.

Figure 5A:
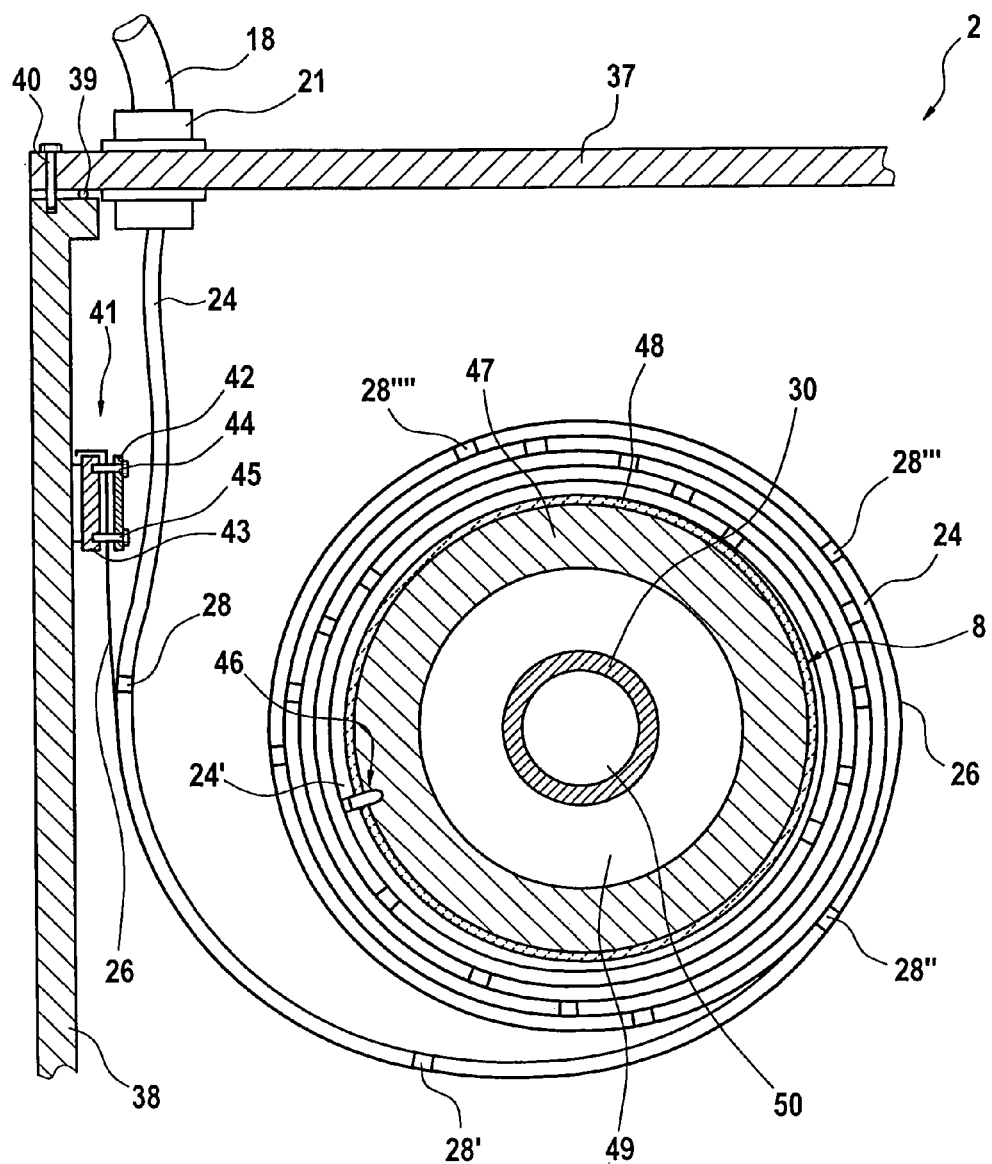

In FIG. 5a is depicted a section along C-C through a segment of the fore-vacuum chamber 2 depicted in FIG. 1 with the axle 8 and the line element 24 connected thereon for the power supply. The lines for the supply of cooling fluid are herein omitted. Evident is a covering 37 of the fore-vacuum chamber 2, which is located on a side wall 38. The covering 37 is connected via a connecting element 40, for example a bolt, with the side wall 38, and between the side wall 38 and the covering 37 a sealing material 39, preferably of elastic rubber, is disposed, such that in the fore-vacuum chamber 2 a vacuum can be generated. The covering 37, as depicted here, comprises a connection fitting 21, into which from the outside a line element 18 can be inserted and fastened. This line element 18 is a cable for the power supply of the pipe cathode 3. However, it is also possible that the substantially flexible line element 18 is a measuring, a control or a signal line. For example, via the control line the magnet systems can be changed or their distance from the target tube can be changed.

From the connection fitting 21 another line element 24 leads to axle 8. The line element 24 has substantially the same properties as the line element 18.

The line element 24 extends along the side wall 38 in the direction of a fastening device 41 for the spiral spring 26. The line element 24 is connected with the spiral spring 26 via elements 28, 28', 28", and on the spiral spring other line elements 23, 25 are also fastened as is shown in FIG. 2 and explained in further detail in conjunction with FIG. 7.

The spiral spring 26 together with the line element 24 fastened on it is wound multiply about the axle 8. Thereby that the spiral spring 26 is comprised of a solid yet flexible material, as for example of a thin steel sheet, it can be wound about the axle 8.

The end 24' of the flexible line element 24 is connected with a clamp or plug device 46 with the outer annulus 47 of the axle 8. This device 46 can also be a combination of plug and clamp device. The outer annulus 47 is comprised of a material with very good conductivity and is preferable insulated with an insulating material. However, it is also feasible for the line elements 23 to 25 to be encompassed by an insulating layer.

Since, as is evident in FIG. 5a, the line element 24 is only connected with the outer annulus 47 of the tube system of axle 8, this is consequently the line element supplying the pipe cathode 3 (FIG. 4) with voltage.

Axle 8 additionally comprises two regions 49 and 50 separated by the fixedly disposed tube 30. The region 49 serves as an inflow for a cooling means, while region 50 serves as an outflow. The functions of regions 49 and 50 can also be reversed.

The spiral spring 26 is fastened on the fastening device 41. The spiral spring 26 is clamped in between two plates 42, 43, the two plates 42, 43 being connected through connection elements 44, 45, for example bolts. The grounded chamber wall is provided on the inside with an insulating layer, such that parasitic plasma discharges between power supply and chamber wall are avoided. Flashover protection is of significance especially if the region of the power supply lies in the process vacuum or in the fore-vacuum.

If, as already described in FIG. 4, the pipe cathode 3 moves about its own axis, the outer annulus 47, or also the insulating layer 48 applied there, also moves, while the tube 30 does not move with it. Through this movement by for example 180° in the clockwise direction, the spiral spring 26 and the line element 24 fastened thereon is partially wound out. If, however, the pipe cathode 3 is rotated counter to the clockwise direction, for example by 170°, the spiral spring 26 together with the line element 24 disposed on it, is wound up again.

In order for the pipe cathode 3 to be able to be rotated by at least 360°, and especially in a pendulum movement described under FIG. 4, a length of line element 24 or of spiral spring 26 is required, which corresponds at least to the length required in order to be connected with the clamp or the plug device 46, plus a length corresponding to the length required to wind the spiral spring 26 with the line element 24 disposed on it once about the axle 8.

However, it is of advantage if the line element 24 as well as the spiral spring 26 have an even greater length. Therewith the other line elements 23, 25 must also have such minimum length, which, however, is not shown here.

In FIG. 5*a* cable 18 is shown as being thicker than cable 24 in the fore-vacuum chamber. However, both cables 18, 24 can have the same diameter. The depiction of FIG. 5*a* is intended to show that here the transition is involved from a round cable outside of the unit to a flat cable within the unit since the latter can be wound up better. If the media are supplied in the fore or intermediate vacuum chamber 2, the voltage-carrying parts do not need to be electrically insulated. So that no short circuits between the cables and the grounded chamber wall occur, the chamber wall must be provided with a flashover or disruptive discharge protection i.e. an insulation.

Figure 5B:
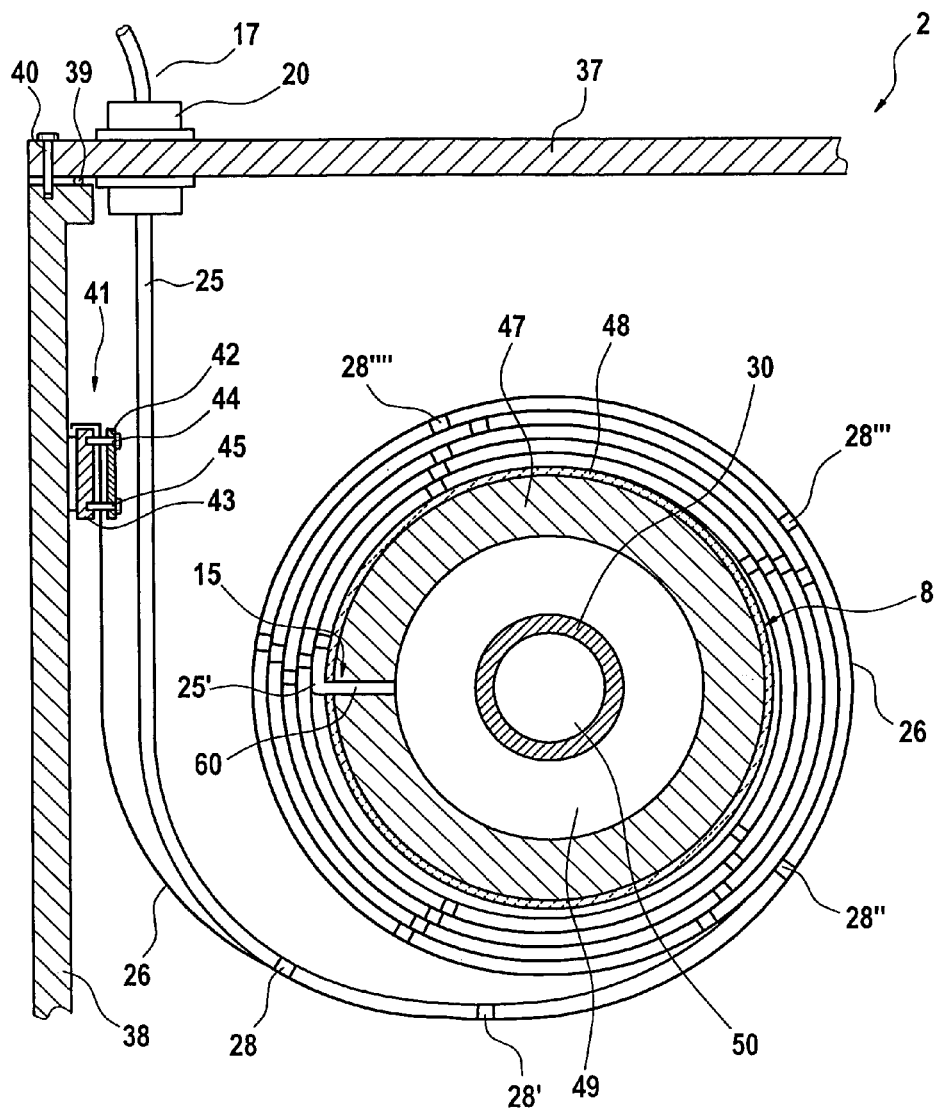

FIG. 5*b* shows a section along C-C through a segment of the fore-vacuum chamber 2 shown in FIG. 1 with axle 8 and the line element 25 connected thereon for the cooling means supply. The cooling means moves from the outside via the line element 17 and the connection fitting 20 into the line element 25 disposed in the fore-vacuum chamber 2. The line elements 25, 17 are hoses, which are preferably comprised of an elastic rubber material.

The hose 25 is at least partially disposed on spiral spring 26 and is here held by means of elements 28, 28', 28", 28''', 28''''. The spiral spring 26 with the hose 25 fastened on it is wound about axle 8.

The end 25' of hose 25 is connected with the outer annulus 47 of axle 8 by means of clamp or plug device 15. This device may also be a combination of clamp and plug device.

The cooling means moves from hose 25 via an opening 60 into the region 49. This region 49 is consequently the inflow system, via which the cooling means, for example water, can be conducted into the pipe cathode 3. The region 50 is the outflow system, via which the coolant is again conducted out of the pipe cathode 3. However, it is also possible to conduct the cooling means via the region 50 into the pipe cathode 3. In this case the cooling means is carried via the region 49 out of the pipe cathode 3 and conducted away again across hose 25 from the fore-vacuum chamber 2. This can take place for example via a pumping system, which supplies the cooling means in advance under pressure.

Figure 6:
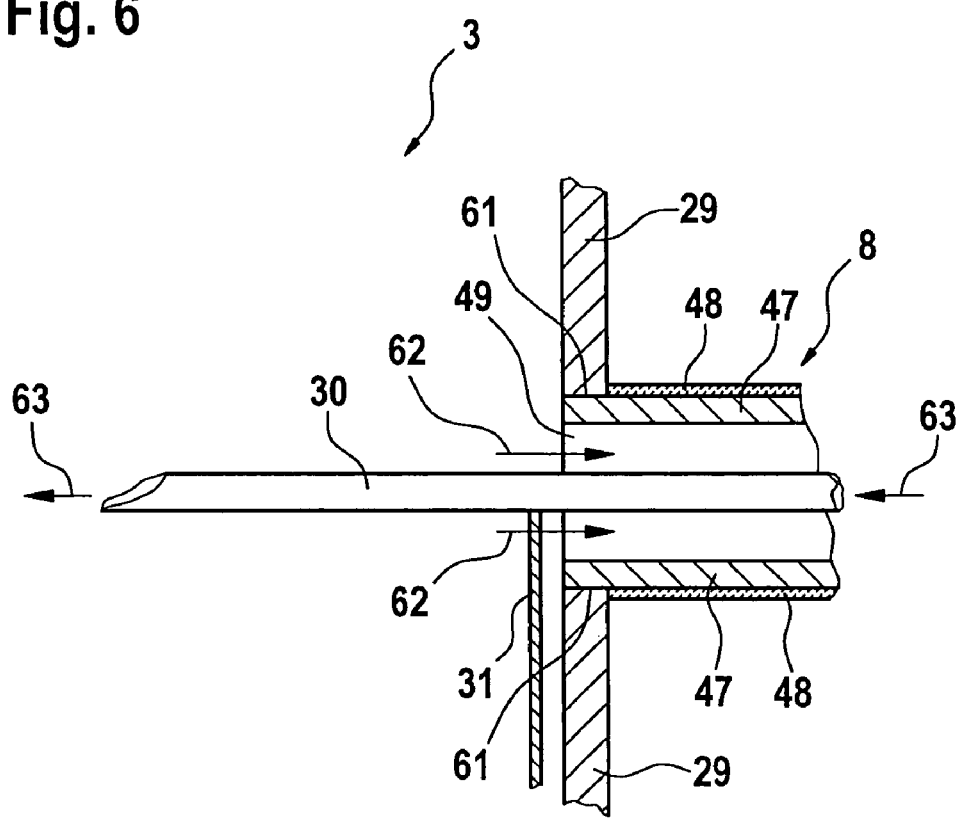

FIG. 6 depicts an enlarged segment of the pipe cathode 3 with axle 8 shown in FIG. 3. Axle 8 represents a tube system with the outer annulus 47, which encompasses the internal tube 30, disposed therein. The outer annulus 47 may be encompassed by an insulating layer 48.

The insulating layer 48 extends only up to the target carrier tube 29 of the pipe cathode 3. Thereby at site 61 contact of the current-carrying annulus 47 with the target carrier tube 29 of the pipe cathode 3 occurs, wherein the target carrier tube 29 is also comprised of a current-conducting material. Therewith the pipe cathode 3 is directly supplied with current.

As can be seen, the cooling means is transported through tube 30 into the pipe cathode 3, which is indicated by arrow 63. The cooling water flows advancing through the tube 30 up to the far end of the cathode in the interior of the target tube, where it exits into the target tube and flows back within the target.

The cooling means can leave the interior of the pipe cathode again via region 49 of the axle 8, which is indicated by arrow 62. The cooling means leaving the interior of the pipe cathode is subsequently discharged via a hose disposed on axle 8, for example hose 25, as is shown in FIG. 5*b*.

If, however, the cooling means is supplied via hose 25 into axle 8, the cooling means reaches the interior of the pipe cathode 3 via region 49 and leaves the pipe cathode 3 again via tube 30. This tube 30 consequently comprises openings in the interior of pipe cathode 3, via which the cooling means can leave the pipe cathode 3 again.

Figure 7:
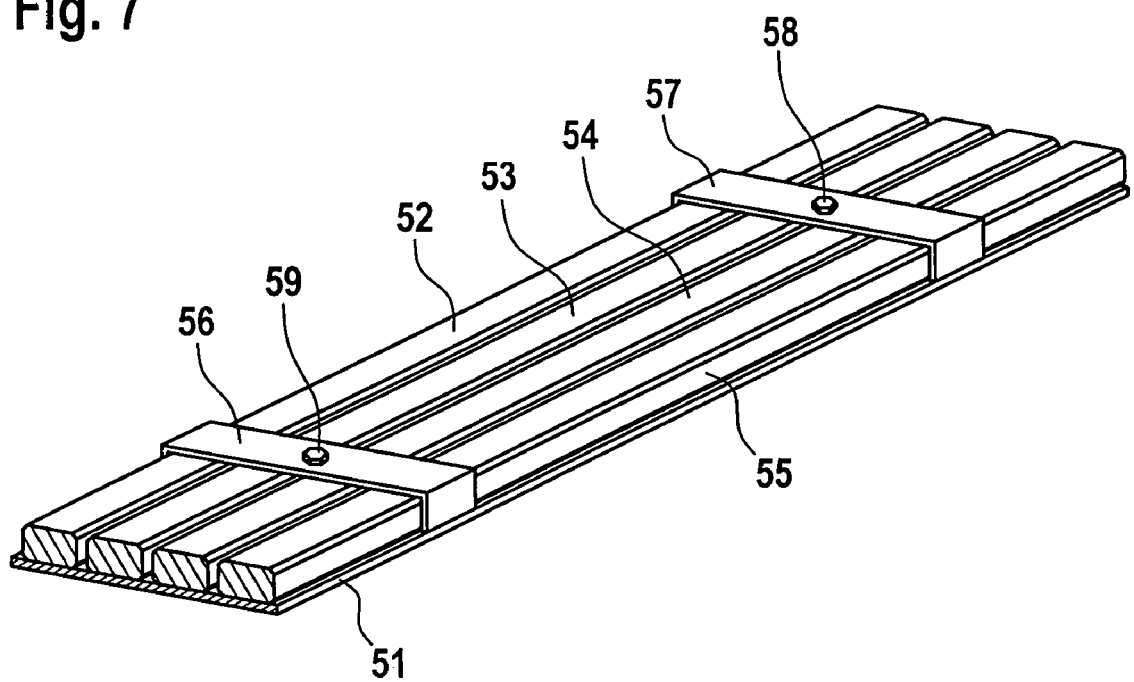

FIG. 7 shows a segment of a flat spring 51 with four line elements 52 to 55 disposed thereon. These line elements 52 to 55 can be cables or hoses substantially comprised of a flexible material. The line elements 52 to 55 are disposed substantially parallel to one another and are held by means of elements 56, 57. The line elements 52 to 55 are encompassed by U-shaped elements 56, 57 disposed on the flat spring 51. By tightening connection elements 58, 59, for example bolts, the sliding of line elements 52 to 55 is no longer possible.

In the embodiment example according to FIGS. 1 to 6 the rotatable receptor 47 is located outside of vacuum chamber 1. However, it may also be located in the process vacuum. Herein the voltage-carrying parts must be electrically insulated since otherwise parasitic plasmas can be generated and electrical flashovers may negatively affect the sputter plasma.

The receptor 47 can also be provided in an additional fore-vacuum. In this case there is no need to consider whether or not synthetic materials outgas and therewith affect the coating process. Voltage-carrying parts do not absolutely need to be insulated. Instead, an electrical insulation on the chamber wall in the region of connection fittings 20 to 22 is however necessary. The receptor can also furthermore be provided under atmospheric pressure. A rotary leadthrough for the rotary drive is necessary in any case. However, sliding contacts and rotatable water connection fittings become unnecessary. The vacuum suitability of the materials employed no longer needs to be taken into consideration. However, for reasons of safety all voltage-carrying parts must be insulated.

The invention claimed is:

1. A sputter apparatus comprising:
 a vacuum chamber,
 a pipe cathode in the vacuum chamber, a cylindrical target connected to the pipe cathode;

a rotatable receptor having an outside surface onto which flexible conducting line elements are wound and from which said flexible conducting line elements are wound out, and connecting elements, with which the flexible conducting line elements are connectable with the rotatable receptor, wherein the rotatable receptor surrounds an internal tube which transports cooling means.

2. The sputter apparatus as claimed in claim 1, wherein connecting elements are at least one of a clamp or plug connection.

3. The sputter apparatus as claimed in claim 1, wherein the rotatable receptor is disposed outside of the vacuum chamber.

4. The sputter apparatus as claimed in claim 1, wherein the rotatable receptor is disposed in the vacuum chamber.

5. The sputter apparatus as claimed in claim 1, wherein the rotatable receptor is disposed in a fore-vacuum chamber.

6. The sputter apparatus as claimed in claim 1, wherein the rotatable receptor is formed tubularly.

7. The sputter apparatus as claimed in claim 1, wherein the flexible conducting line elements are power lines.

8. The sputter apparatus as claimed in claim 1, wherein the flexible conducting line elements are cooling hoses.

9. The sputter apparatus as claimed in claim 1, wherein the flexible conducting line elements are at least partially disposed on a spiral flat spring.

10. The sputter apparatus as claimed in claim 9, wherein the flexible conducting line elements are fixedly connected with the spiral flat spring via connecting elements.

11. The sputter apparatus as claimed in claim 9, wherein the spiral flat spring comprises a substantially flexible material.

12. The sputter apparatus as claimed in claim 9, wherein the spiral flat spring conducts electric energy.

13. The sputter apparatus as claimed in claim 1, wherein the flexible conducting line elements are energy lines.

14. The sputter apparatus as claimed in claim 1, wherein the flexible conducting line elements are energy lines.

15. The sputter apparatus as claimed in claim 9, wherein the spiral flat spring is disposed on a fastening device.

16. The sputter apparatus as claimed in claim 1, wherein the flexible conducting line elements are connected with an axle via connecting elements.

17. A method comprising sputtering a sputter coating on a substrate by
  a) rotating and sputtering a cylindrical target connected to a pipe cathode by a first angle between 150° to 270° about its longitudinal axis (A-A) in a first direction, wherein flexible conducting line elements are wound onto a rotatable receptor or wound from it;
  b) rotating and sputtering the cylindrical target connected to the pipe cathode by a second angle about its longitudinal axis (A-A) in a second direction opposite to the first direction, wherein the second angle is greater or smaller by a defined magnitude than the first angle and wherein the flexible conducting line elements are wound from the rotatable receptor or wound onto it; and
  c) repeating steps a) and b) until the cylindrical target connected to the pipe cathode has moved at least 360° about its longitudinal axis.

18. The method as claimed in claim 17, wherein after the cylindrical target connected to the pipe cathode has moved by at least 360° about its longitudinal axis (A-A), the method is repeated wherein the rotational movements now take place in opposite directions.

19. The method as claimed in claim 17, wherein the angle in step b) is greater or smaller by approximately 10° than in step a).

20. The method as claimed in claim 17, wherein a spiral flat spring on which the flexible conducting line elements are disposed, is also wound onto the rotatable receptor or wound from it.

21. The sputter apparatus as claimed in claim 16, wherein the length of the flexible conducting line elements corresponds at least to the length required for the connection with the connecting elements, plus the length required to wind a spiral flat spring with the flexible conducting line elements disposed thereon once about the axle.

22. The sputter apparatus as claimed in claim 12, wherein the flexible conducting line elements are energy lines.

* * * * *